United States Patent
Tokumiya

(10) Patent No.: US 7,504,761 B2
(45) Date of Patent: Mar. 17, 2009

(54) DRIVING DEVICE

(75) Inventor: Motoyoshi Tokumiya, Saimata (JP)

(73) Assignee: Fujinon Corporation, Saitama-shi, Saitama (JP)

( * ) Notice: Subject to any disclaimer, the term of this patent is extended or adjusted under 35 U.S.C. 154(b) by 38 days.

(21) Appl. No.: 11/603,132

(22) Filed: Nov. 22, 2006

(65) Prior Publication Data
US 2007/0114888 A1 May 24, 2007

(30) Foreign Application Priority Data
Nov. 24, 2005 (JP) ............................ P2005-338940

(51) Int. Cl.
*H02N 2/00* (2006.01)
(52) U.S. Cl. .................. 310/323.17; 310/12; 310/329
(58) Field of Classification Search .............. 310/12, 310/323.01–323.09, 323.17, 328, 329
See application file for complete search history.

(56) References Cited

U.S. PATENT DOCUMENTS

| | | | | |
|---|---|---|---|---|
| 3,246,608 A | * | 4/1966 | Cooper | 104/134 |
| 4,630,941 A | * | 12/1986 | Chainer et al. | 384/1 |
| 4,672,256 A | * | 6/1987 | Okuno et al. | 310/323.07 |
| 5,121,025 A | * | 6/1992 | Toda | 310/358 |
| 5,404,065 A | * | 4/1995 | Takagi | 310/323.03 |
| 5,523,643 A | * | 6/1996 | Fujimura et al. | 310/328 |
| 6,134,057 A | | 10/2000 | Ueyama et al. | |
| 6,140,750 A | * | 10/2000 | Ueyama | 310/369 |
| 2005/0253483 A1 | | 11/2005 | Okamoto | |

FOREIGN PATENT DOCUMENTS

| | | | |
|---|---|---|---|
| JP | 52-9388 | * | 7/1975 |
| JP | 2002-142470 A | | 5/2002 |
| WO | WO-2006/099924 A1 | | 9/2006 |

* cited by examiner

*Primary Examiner*—Thomas M Dougherty
(74) *Attorney, Agent, or Firm*—Birch, Stewart, Kolasch & Birch, LLP

(57) ABSTRACT

A driving device, comprises: an electro-mechanical conversion element enabled to expand and contract in response to input of an electrical signal; and a frictional member that is frictionally-engaged with the electro-mechanical conversion element and that is mounted on the electro-mechanical conversion element movably along a longitudinal direction of the electro-mechanical conversion element.

4 Claims, 5 Drawing Sheets

DRIVING DEVICE

BACKGROUND OF THE INVENTION

1. Field of the Invention

The present invention relates to a driving device using an electro-mechanical conversion element.

2. Description of the Related Art

Hitherto, a driving device employing a piezoelectric element (electromechanical conversion element), which is used to drive a lens of a digital camera or a camera phone, has been known. Such a driving device is configured so that one of end portions in the expansion/contraction direction of the piezoelectric element is fixed by a platform, and that a shaft-like driving frictional member extending in the expansion/contraction direction of the piezoelectric element is fixed to the other end portion of the piezoelectric element. A frictional engagement member capable of moving along the driving frictional member is mounted on the circumferential surface of the driving frictional member by being inserted thereon. The lens serving as a driven member is attached thereto through the frictional engagement member.

In such a driving device, the piezoelectric element is expanded or contracted by applying a pulse-like voltage to the piezoelectric element. Thus, the driving frictional member moves. In a case where the piezoelectric element deforms at a low rate, the frictional engagement member moves together with the driving frictional member. In a case where the piezoelectric element deforms at a high rate, the frictional engagement member remains located at the same position due to inertia of the masses of the frictional engagement member and the driven member, whereas the driving frictional member moves. Therefore, the frictional engagement member frictionally engaged with the driving frictional member intermittently moves with fine pitches. Thus, the lens attached to the frictional engagement member can be moved (see, for example, JP-A-2002-142470).

However, in this related driving device, it is difficult to position the electromechanical conversion element and the driving frictional member with good precision. Also, when the deviation of the position of the driving frictional member with respect to the electromechanical conversion element occurs, it is difficult to move an object, which is to be moved, with good precision.

Also, in a case where an impact is applied to the related driving device due to the dropping thereof, a bonded portion between the electromechanical conversion element and the driving frictional member may be damaged.

SUMMARY OF THE INVENTION

The invention is accomplished to solve the above problems. Accordingly, the invention aims at providing a driving device enabled to move an object, which is to be moved, with good precision and also enabled to enhance impact strength.

According to the invention, there is provided a driving device comprising: an electro-mechanical conversion element enabled to expand and contract in response to input of an electrical signal; and a frictional member that is frictionally-engaged with the electromechanical conversion element and that is mounted on the electro-mechanical conversion element movably along a longitudinal direction of the electro-mechanical conversion element.

According to such a driving device, the frictional member is frictionally engaged with the electro-mechanical conversion element so that the frictional member can move along the longitudinal direction of the electro-mechanical conversion element. Thus, this driving device does not need to have a driving frictional member as provided in the related driving device. Consequently, it is unnecessary to bond the driving frictional member and the electro-mechanical conversion element. Also, this eliminates fear of occurrence of deviation of the position of the driving frictional member with respect to the electromechanical conversion element. Consequently, the frictional member or an object to be moved, which is attached to the frictional member, can be moved with good precision. Additionally, the device according to the invention is provided with no junction portion between the driving member and the electro-mechanical conversion element, which is provided therebetween in the related device. This eliminates the fear of damaging the device at the junction portion. Consequently, the impact strength can be enhanced. Also, the number of components is reduced. Thus, the cost of the device can be reduced. Additionally, the driving device of the invention is configured so that the electromechanical conversion element also serves as the driving friction member provided in the related device. Thus, the miniaturization of the device can be achieved.

Also, the driving device according to the invention may include a stationary member, wherein one end of the electro-mechanical conversion element is fixed to the stationary member.

Also, the driving device according to the invention may include: a stationary member; a support member that supports the electro-mechanical conversion element with respect to the stationary member; and a weight member provided to be neither supported by nor fixed to the stationary member.

DETAILED DESCRIPTION OF THE INVENTION

Figure 1:
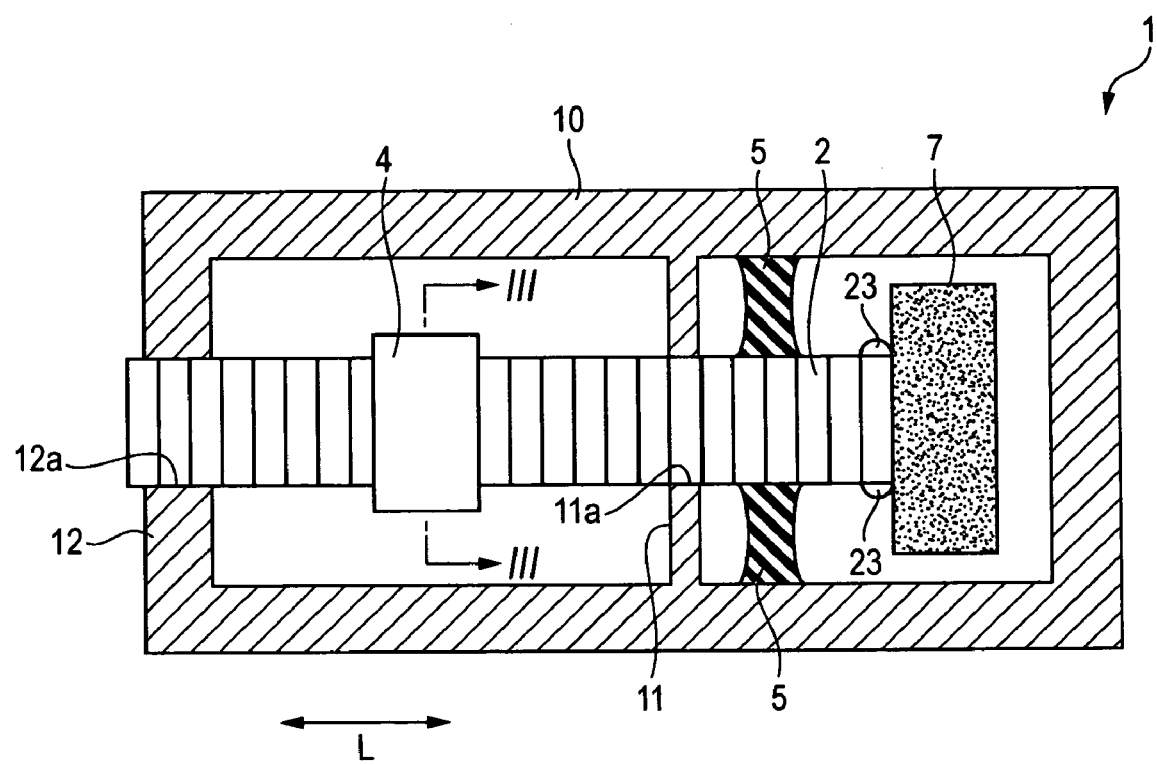
FIG. 1 is a cross-sectional view illustrating a driving device according to a first embodiment of the invention.

Hereinafter, embodiments of the invention are described in detail by referring to the accompanying drawings. In the description with reference to the drawings, same reference numerals designate same elements. Thus, redundant description of such elements is omitted.

First Embodiment

FIG. 1 is a cross-sectional view illustrating a driving device according to a first embodiment of the invention.

As shown in FIG. 1, a driving device 1 according to the present embodiment has a piezoelectric element 2, a frictional member 4, and a support member 5. A moving lens (not shown) attached to the frictional member 4 is employed as an object to be moved. Thus, the driving device 1 drives the moving lens. The piezoelectric element 2 is an electromechanical conversion element enabled to expand and contract in response to input of an electrical signal. Thus, the piezoelectric element 2 can expand and contract in a predetermined direction. The piezoelectric element 2 is connected to a control portion (not shown), which inputs electrical signals to the piezoelectric element 2 to thereby cause the piezoelectric element 2 to expand and contract. For example, the piezoelectric element 2 having two input terminals is used. The piezoelectric element 2 iteratively expands and contracts by repeatedly increasing and decreasing voltages to be inputted to the input terminals of the piezoelectric element 2.

Figure 2:
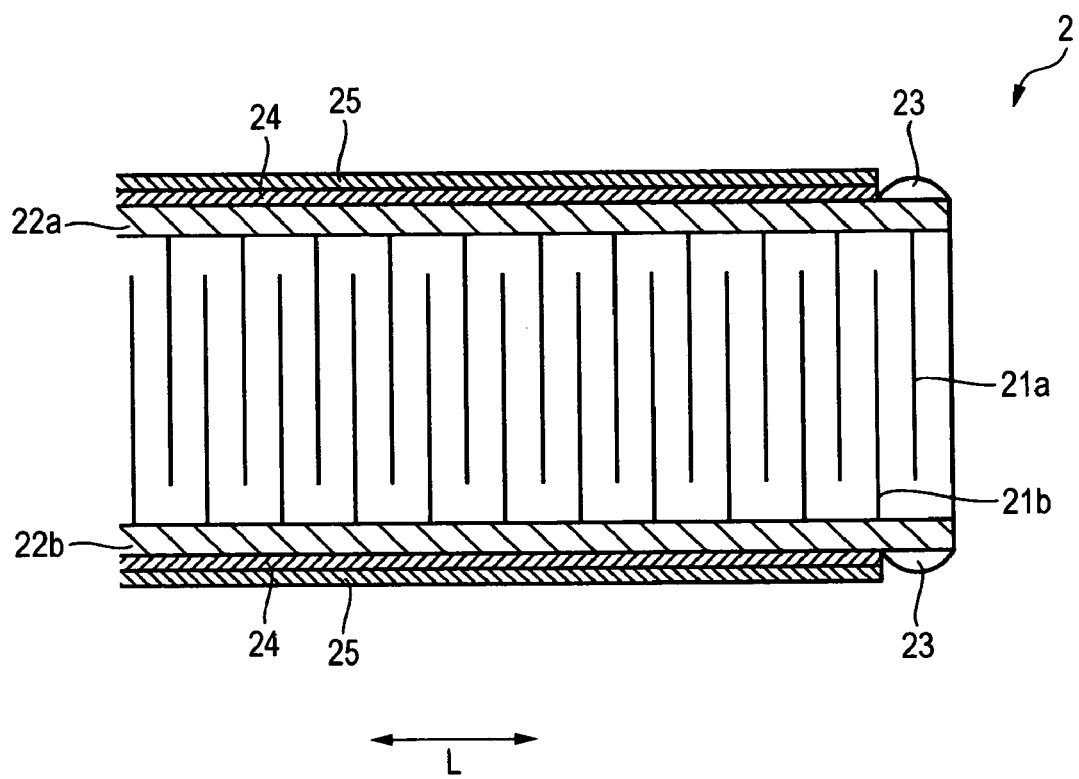
FIG. 2 is a cross-sectional view taken along the longitudinal direction of a piezoelectric element shown in FIG. 1.

FIG. 2 is a cross-sectional view of the piezoelectric element, which is taken along the longitudinal direction of the piezoelectric element.

As shown in FIG. 2, the piezoelectric element 2 is formed by laminating internal electrodes 21a and 21b in a longitudinal direction L. External electrodes 22a and 22b extend along the longitudinal direction L outside the internal electrodes 21a and 21b. Paired adjacent internal electrodes 21a and 21b are electrically connected to different external electrodes 22a and 22b, respectively. An input terminal 23 is provided in each of the external electrodes 22a and 22b and is electrically connected to the control portion. The exterior of each of the external electrodes 22a and 22b is covered with a resist 24 and a protective coating 25. Thus, a sliding surface of the piezoelectric element 2, on which the frictional member 4 slides, is formed.

The frictional member 4 is movably mounted on the piezoelectric element 2, as shown in FIG. 1. The frictional member 4 is frictionally engaged with the piezoelectric element 2 and is adapted to freely move along the longitudinal direction L. For example, the frictional member 4 is engaged with the piezoelectric element 2 with a predetermined frictional coefficient. The frictional member 4 is pressed against the piezoelectric element 2 by a constant pressing force. Thus, the frictional member 4 is mounted so that when the frictional member 4 is moved, a constant frictional force is generated. The frictional member 4 is moved along the piezoelectric element 2 against the frictional force by imparting a moving force, whose strength exceeds that of the frictional force, to the frictional member 4.

The piezoelectric element 2 is supported by a stationary member 10 through the support member 5. The support member 5 is constituted by a resin material that is filled between the piezoelectric element 2 and the stationary member 10 and that is then hardened. An elastic deformation member adapted to elastically deform in response to the expansion/contraction of the piezoelectric element 2 is used as the material of the support member 5. The material of the elastic deformation member is, for example, a silicon resin material.

The support member 5 is disposed to cover the periphery of the piezoelectric element 2. Although the support member 5 is shown at two places in FIG. 1, this figure shows the two cross-sections 5, 5 of the single continuous support member at the two places.

The stationary member 10 functions as a casing or a frame member, to which the piezoelectric element 2 is assembled. In the stationary member 10, partition portions 11 and 12 adapted to partition a region, in which the frictional member 4 is disposed, are formed. Through holes 11a and 12a, through which the piezoelectric element 2 is passed, are formed in the partition portions 11 and 12, respectively.

A weight member 7 is attached to one of end portions of the piezoelectric element 2. The weight member 7 transmits the expanding/contracting force of the piezoelectric element 2 to a side (the left side, as viewed in FIG. 1) opposite to the weight member 7. Preferably, a member obtained by mixing metal powder into an elastically deformable material is used as the weight member 7. The weight of the member 7 can be increased by mixing metal powder there into. The use of the elastically deformable member enables the attenuation of unnecessary resonance caused by an operation of the piezoelectric element 2.

The weight member 7 is provided to be neither supported by nor fixed to the stationary member 10. That is, the weight member 7 is neither supported directly by nor fixed directly to the stationary member 10. Also, the weight member 7 is neither supported by nor fixed to the stationary member 10 through an adhesive agent or a resin material so that the movement of the weight member 7 is restrained.

Figure 3:
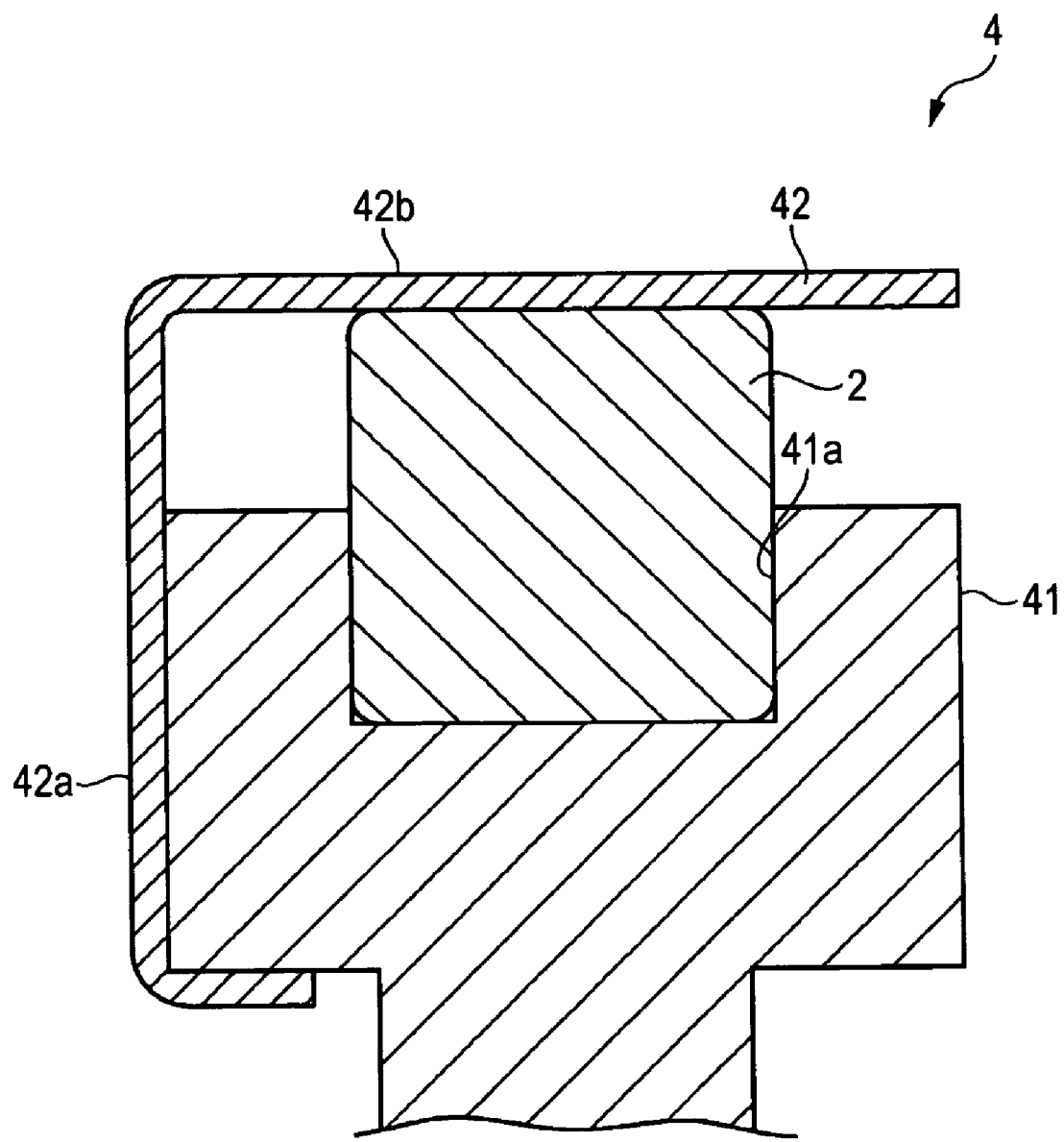
FIG. 3 is a cross-sectional view of a frictional member of the driving device, which is taken on line III-III shown in FIG. 1.

FIG. 3 is a cross-sectional view of the frictional member 4 of the driving device, which is taken on line III-III shown in FIG. 1.

As shown in FIG. 3, the frictional member 4 includes, for example, a body portion 41 and a pressing member 42. The body portion 41 is pressed against the piezoelectric element 2 by a constant force of the pressing member 42. A concave portion 41a is formed in the body portion 41. The body portion 41 is disposed so that the piezoelectric element 2 abuts against the inner surface of the concave portion 41a. Thus, the frictional member 4 is disposed by utilizing the concave portion 41a. Consequently, the frictional member 4 can stably be mounted on the piezoelectric element 2.

For example, a cross-sectionally L-shaped plate spring member is used as the pressing member 42. One side of the pressing portion 42 is caught in the body portion 41. The other side of the pressing portion 42 is disposed at a place opposed to the inner surface of the concave portion 41a. Thus, the piezoelectric element 2 accommodated in the concave portion 41a can be sandwiched by the body portion 41 and the side 42b. Consequently, the body portion 41 can be pressed against the piezoelectric element 2.

Thus, the body portion 41 is pressed by a constant force of the pressing portion 42 against the piezoelectric element 2. Thus, the frictional member 4 is frictionally engaged with the piezoelectric element 2. That is, the body portion 41 and the pressing portion 42 are pressed by a constant pressing force against the piezoelectric element 2. The frictional member 4 is mounted thereon so that when the frictional member 4 is moved, a constant frictional force is generated.

Next, a basic action of the driving device 1 according to the present embodiment is described below.

As shown in FIG. 1, an electrical signal is inputted to the piezoelectric element 2 is inputted. The piezoelectric element 2 iteratively expands and contracts in response to the input of the electrical signal. Electrical signals are used to cause the piezoelectric element 2 to expand and contract so that the expansion rate of the piezoelectric element 2 differs from the contraction rate thereof. For example, as illustrated in FIGS. 4 and 5, pulse signals, each of which is adapted so that a voltage rise rate (voltage increase rate) differs from a voltage drop rate (voltage decrease rate), are used as the electrical signals.

Figure 4:
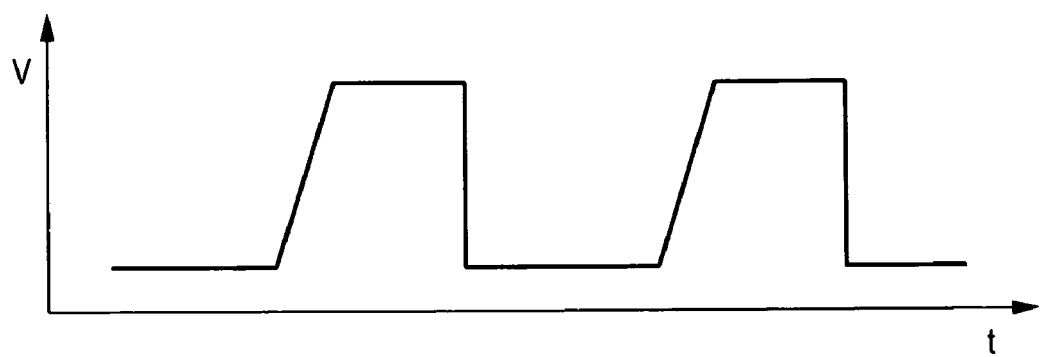
FIG. 4 is an explanatory graph illustrating an electric signal inputted to the piezoelectric element of the driving device shown in FIG. 1.

In a case where an electrical signal shown in FIG. 4 is inputted to the piezoelectric element 2, the voltage rise rate is low, while the voltage drop rate is high. Thus, the piezoelectric element 2 slowly expands and quickly contracts. At that time, the piezoelectric element 2 is movably supported by the support member 5. However, because the weight member 7 having a large weight is provided, the weight member 7 does not largely move in response to the expansion/contraction of the piezoelectric element 2. The piezoelectric element 2 expands to a side opposite to the weight member 7.

As the piezoelectric element 2 slowly expands to the opposite to the weight member 7, the frictional member 4 moves together with the piezoelectric element 2. Conversely, when the piezoelectric element 2 quickly contracts toward the weight member 7, the frictional member 4 does not move together with the piezoelectric element 2 due to inertia. Therefore, when the piezoelectric element 2 repeats expansion and contraction, the frictional member 4 moves in a direction in which the frictional member 4 moves away from the weight member 7. Then, a moving lens provided integrally with the frictional member 4 is moved in a direction in which the moving lens moves away from the weight member 7.

Figure 5:
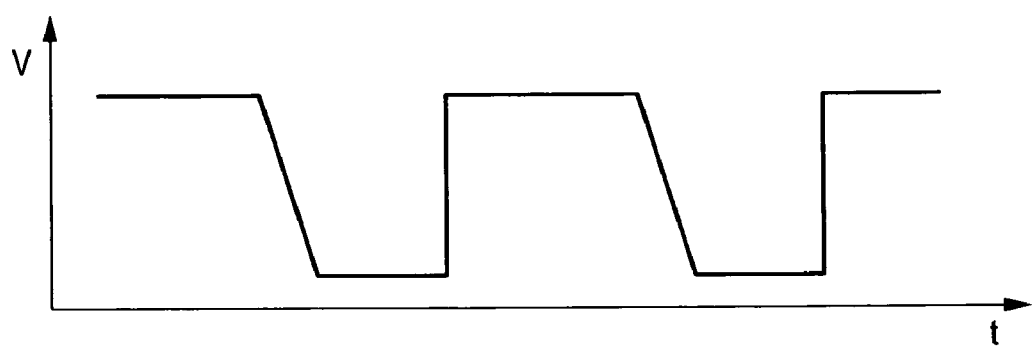
FIG. 5 is an explanatory graph illustrating another electric signal inputted to the piezoelectric element of the driving device shown in FIG. 1.

In contrast, in a case where an electrical signal shown in FIG. 5 is inputted to the piezoelectric element 2, the voltage rise rate is high, while the voltage drop rate is low. Thus, the piezoelectric element 2 quickly expands and slowly contracts.

At that time, even in a case where the piezoelectric element 2 quickly expands to the side opposite to the weight member 7, the frictional member 4 does not move together with the piezoelectric element 2 due to inertia. Conversely, when the piezoelectric element 2 slowly contacts toward the weight member 7, the frictional member 4 moves together with the piezoelectric element 2. Thus, when the piezoelectric element 2 iteratively expands and contracts, the frictional member 4 moves in a direction in which the frictional member 4 comes closer to the weight member 7. Also, the moving lens provided integrally with the frictional member 4 moves in a direction in which the moving lens comes loser to the weight member 7.

Thus, the frictional member 4 and the moving lens can be moved and controlled by inputting predetermined electrical signals to the piezoelectric element 2.

As described above, in accordance with the driving device 1 according to the present embodiment, the frictional member 4 is frictionally engaged with the piezoelectric element 2 to be able to move along the longitudinal direction L of the piezoelectric element 2. Thus, the driving device according to the present invention does not need to have a driving frictional member as provided in the related device. Consequently, in the case of the driving device according to the invention, there is no need for bonding the driving frictional member to the electromechanical conversion element 2. This eliminates the fear of occurrence of deviation of the position of the driving frictional member with respect to the electromechanical conversion element. Consequently, the moving lens attached to the frictional member 4 can be moved with good precision. Additionally, the device according to the invention is provided with no junction portion between the driving member and the piezoelectric member 2, which is provided therebetween in the related device. This eliminates the fear of damaging the device at the junction portion. Consequently, the impact strength can be enhanced. Also, the number of components is reduced. Thus, the cost of the device can be reduced. Additionally, the driving device of the invention is configured so that the piezoelectric element 2 also serves as the driving friction member provided in the related device. Thus, the miniaturization of the device can be achieved.

Second Embodiment

Next, a driving device according to a second embodiment of the invention is described below.

Figure 6:
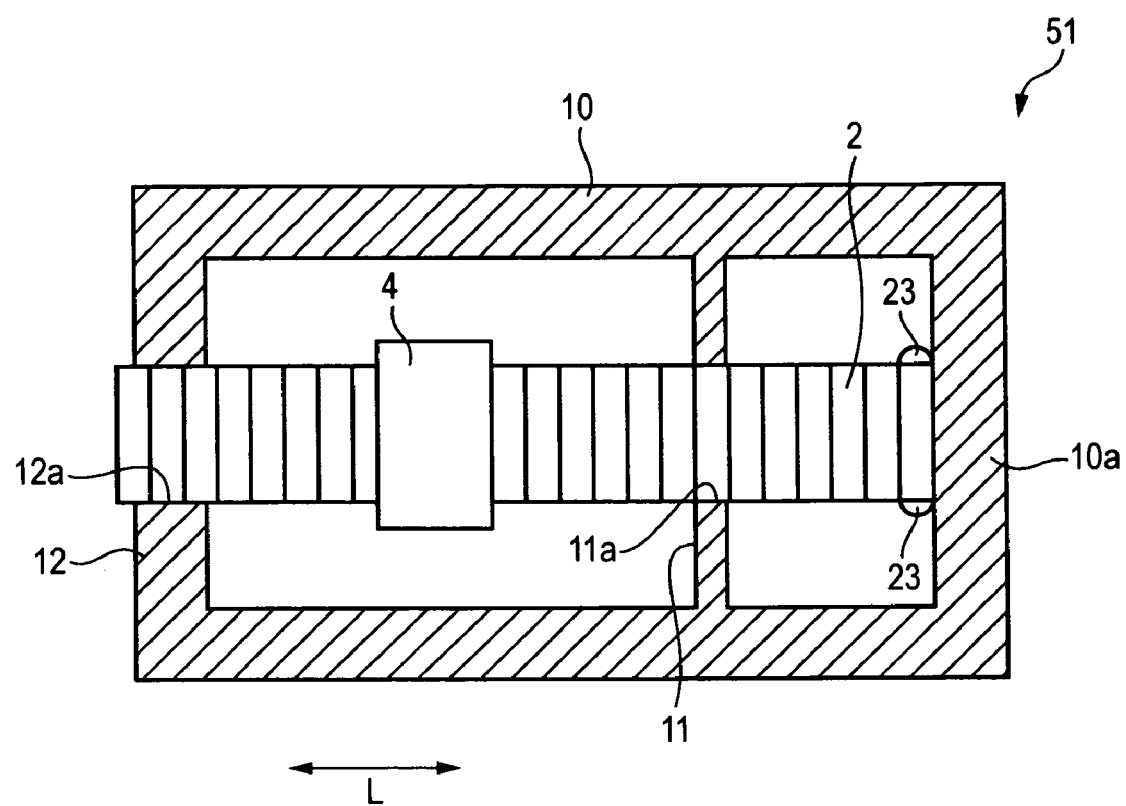
FIG. 6 is a cross-sectional view illustrating a driving device according to a second embodiment of the invention.

FIG. 6 is a cross-sectional view illustrating the driving device according to the second embodiment of the invention. A driving device 51 according to the second embodiment differs from the driving device 1, which has the support member 5 and is configured to fix the one end of the piezoelectric element 2 to the stationary member 10, according to the first embodiment in that the driving device 51 has neither a support member nor a weight member and that one end of a piezoelectric element 2 is fixed to a stationary member 10. In the driving device 51 according to the second embodiment, the one end of the piezoelectric element 2 is bonded to a wall 10a of the stationary member 10 with an adhesive agent. With this configuration, the driving device 51 according to the second embodiment can obtain advantages similar to those of the driving device 1 according to the first embodiment.

Incidentally, each of the above embodiments is an example of the driving device according to the invention. The driving device according to the invention is not limited to those according to the above embodiments. The driving devices according to the embodiments may be modified or can be applied to other devices without departing from the spirit and scope of the invention. Although the driving device according to the invention applied to a device adapted to drive the moving lens has been described in the foregoing description of the embodiments, the driving device according to the invention may be applied to a device adapted to drive an element other than the moving lens.

Additionally, the above embodiments may be configured to have a position detection sensor adapted to detect the position of the frictional member 4 or the object to be moved. The movement of the frictional member 4 and the moving lens may be controlled according to position information outputted by the position detection sensor.

According to the driving apparatus of the invention, the frictional member is mounted on the electromechanical conversion element. Thus, an object to be moved can be moved with good accuracy. Also, the impact strength can be enhanced.

The entire disclosure of each and every foreign patent application from which the benefit of foreign priority has been claimed in the present application is incorporated herein by reference, as if fully set forth.

What is claimed is:

1. A driving device comprising:
   an electromechanical conversion element enabled to expand and in response to input of an electrical signal, the electromechanical conversion element extending longitudinally between two opposite end portions;
   a stationary member;
   a weight member that is not supported by or otherwise fixed to the stationary member, the weight member being mounted to only one of the first and second opposite end portions of the electromechanical conversion element so as to transmit an expansion/contraction force produced by the electrical signal to the opposite end portion not mounting the weight member; and
   a frictional member that is frictionally-engaged with the electromechanical conversion element and that is mounted on the electromechanical conversion element so as to be movable along a longitudinal direction of the electromechanical conversion element in response to expansion/contraction of the electromechanical conversion element.

2. The driving device according to claim 1, wherein the frictional member includes a body portion with a side having a concave portion configured to receive a part of the electromechanical conversion element therein and a pressing member having one flat end part engaged with a side of the body portion opposed to the side having the concave portion and a second flat end part configured to press a surface of the electromechanical conversion element opposed to the part of the electromechanical conversion element received by the concave portion.

3. The driving device according to claim 1, wherein the weight member includes elastically deformable material to enable attenuation of resonances caused by the expansion/contraction of the electromechanical conversion element.

4. The driving device according to claim 1, further including a support member positioned between the two opposite end portions of the electromechanical conversion element so as to support the electromechanical conversion element with respect to the stationary member, the support member including an elastically deformable material that elastically deforms in response to the expansion/contraction of the electromechanical conversion element.

* * * * *